United States Patent [19]

Powell et al.

[11] Patent Number: 4,612,512

[45] Date of Patent: Sep. 16, 1986

[54] AMPLIFIER CIRCUIT PACKAGING CONSTRUCTION

[75] Inventors: Jack Powell, Hermosa Beach; Charles E. Liatsos, Pacific Palisades, both of Calif.

[73] Assignee: TRW Inc., Redondo Beach, Calif.

[21] Appl. No.: 621,333

[22] Filed: Jun. 15, 1984

[51] Int. Cl.[4] .............................................. H03F 3/60
[52] U.S. Cl. ........................................ 330/66; 330/53; 330/151; 330/286
[58] Field of Search ................... 330/53, 66, 149, 151, 330/286, 287; 333/246, 247, 12; 357/75, 81; 174/16 HS; 361/386, 388, 389, 399

[56] References Cited

U.S. PATENT DOCUMENTS

| | | | |
|---|---|---|---|
| 3,267,333 | 8/1966 | Schultz | 317/100 |
| 3,359,461 | 12/1967 | Schuler et al. | 317/100 |
| 3,699,394 | 10/1972 | Schuler | 317/100 |
| 3,764,856 | 10/1973 | Martin | 317/100 |
| 3,829,598 | 8/1974 | Darnell | 174/15 R |
| 3,958,195 | 5/1976 | Johnson | 333/247 |
| 4,096,546 | 6/1978 | Gabr | 361/383 |
| 4,120,020 | 10/1978 | Uden et al. | 361/386 |
| 4,130,807 | 12/1978 | Hall et al. | 330/149 X |
| 4,222,090 | 9/1980 | Jaffe | 361/386 |
| 4,235,283 | 11/1980 | Gupta | 165/80 C |
| 4,241,380 | 12/1980 | Lehmann et al. | 361/383 |
| 4,251,852 | 2/1981 | Ecker et al. | 361/386 |

Primary Examiner—Eugene R. LaRoche
Assistant Examiner—Steven J. Mottola
Attorney, Agent, or Firm—Noel F. Heal; Donald R. Nyhagen

[57] ABSTRACT

A packaging technique for radio-frequency circuits, such as feed-forward amplifiers, in which a single ground plane is formed between active components of the circuit and a circuit board bearing passive components of the circuit. The ground plane comprises a metallized face of the circuit board and a metal heat sink attached to each active component. The assembly, including the circuit board, heat sinks and active and passive components, is supported on a ledge in the walls of a metal housing, such that heat is conducted laterally through the ground plane and directly into the walls of the housing. The walls of the housing, including an intermediate wall between active amplifier components, also serve to isolate the active components from each other and from the environment. The plane also serves to isolate the active components from the passive ones.

9 Claims, 5 Drawing Figures

AMPLIFIER CIRCUIT PACKAGING CONSTRUCTION

CROSS-REFERENCE TO RELATED APPLICATION

This application, Ser. No. 621,334, is related to a concurrently filed application by the same inventors and assigned to the same assignee as this application, entitled "Feed-Forward Circuit."

BACKGROUND OF THE INVENTION

This invention relates generally to circuit packaging techniques, and more particularly, to techniques for packaging high-frequency amplifiers, such as feed-forward amplifiers used in cable television and other applications. Since the invention is to be described with reference to a high-frequency feed-forward amplifier, an understanding of the principles of operation of the amplifier is necessary by way of background.

In recent years, cable television systems have been required to handle an increasing number of channels. Distortion and cross-modulation between the channels limits the number of amplifiers that can be cascaded and the maximum spacing between amplifiers.

A feed-forward technique is commonly used to reduce the distortion in individual amplifiers by a factor of at least one hundred over relatively wide bandwidths. The basic technique involves the use of two cancellation loops. In a signal cancellation loop, the distorted signal from a main amplifier is subtractively combined with a delayed form of the original signal, to produce a signal containing substantially only error components. In the second cancellation loop, the error signal derived from the signal cancellation loop is amplified, and fed forward to be subtractively combined with the output of the main amplifier. The error components cancel and a distortion-free signal remains.

While the theory of feed-forward error cancellation is relatively simple and well known, a practical device must control signal amplitudes and phase angles to close tolerances in order to achieve error cancellation over a wide frequency band. The cross-referenced application is concerned with an approach to accomplish this objective. Another aspect of the design of such an amplifier is that, like all radio-frequency (rf) circuits, it requires close attention to the manner in which grounding is effected, and it is subject to heating and cross-modulation problems, especially if housed in a small, low-cost package.

Poor grounding, or long paths to ground, can result in spurious amplifier feedback signals. These may vary in strength and polarity across the frequency band in which the amplifier operates, and therefore create an undesirable "ripple" in the gain-frequency characteristic of the amplifier. Accordingly, a key requirement is that there be a reliable grounding structure, with extremely short paths to ground.

Another concern in packaging of rf amplifier circuits is that the various circuit modules have to be adequately isolated from each other and from the environment of the amplifier. A sometimes opposing consideration is that the device package should be as small as possible. The size and construction of the circuit package also play an important role in determining how heat is dissipated from the circuit. Ideally, the high-power components, namely the amplifier modules, should be located as close as possible to a heat sink. Yet another requirement for amplifiers of this type is that certain circuit components that are used for tuning must be conveniently accessible.

Feed-forward amplifiers of the prior art fall into two categories: discrete and hybrid implementations. Amplifiers in the discrete category are conveniently modular, but have poor grounding and poor isolation between components. Tuning is difficult, and it is also difficult to achieve high gains or high bandwidths. Hybrid amplifiers consist of an alumina substrate carrying all of the active and passive components, soldered onto a metal block that serves as both as ground plane and a heat sink. The resulting lack of modularity results in poor component isolation.

It will be appreciated from the foregoing that there is a need for a packaging construction that addresses all of these problems together. Basically, the ideal package for an rf amplifier should have very good grounding properties, heat dissipation properties, and isolation properties. Importantly, these properties must be obtained without high cost, in a package that is convenient to assemble and to effect circuit tuning. The present invention is directed to these ends.

SUMMARY OF THE INVENTION

The present invention resides in an rf amplifier package having a single homogenous ground plane, and a construction that permits heat flow directly into the housing of the package. Briefly, and in general terms, the construction of the invention comprises a circuit board having passive components and circuit connections formed on one face and having its other face metalized, and further comprises active components formed on individual metal heat sinks, which are bonded to the metallized face of the circuit board to form a single homogenous ground plane. The construction also includes a housing having walls with ledges formed in them in such a position as to closely contact the heat sinks of the active components, to provide heat flow paths into the housing.

The single ground plane of the invention provides extremely good grounding for the amplifier, since both active and passive components are relatively close to the ground plane, and the grounding paths are therefore very short. Heat generated by the active components is efficiently dissipated through the heat sinks to the housing, and the components are well isolated from each other and from the environment. In the illustrative embodiment of the invention, the housing has an intermediate wall of the same height as the wall ledges. The intermediate wall not only serves to provide an additional heat flow path from the heat sinks to the housing, but also separates two active components, such as amplifier modules, and provides increased isolation between them.

Another advantage of the construction of the invention is that the active components, i.e. the amplifier modules, may be assembled and tested separately, before final assembly. In a feed-forward amplifier application, two amplifiers have to be closely matched in gain characteristics, and it is therefore important to be able to test the amplifier modules before final assembly. In addition, mounting of the passive components on the upper face of the circuit board means that these components are conveniently accessible for tuning purposes.

It will be appreciated from the foregoing that the present invention represents a significant advance in the field of amplifier and rf circuit packaging techniques. In particular, the construction of the invention is a low-cost approach that provides good grounding, and therefore improved amplifier performance, good heat conduction and dissipation, and good isolation. In addition, the construction is convenient to implement in just two soldering steps, and leaves tunable components easily accessible after final assembly. Other aspects and advantages of the invention will become apparent from the following more detailed description, taken in conjunction with the accompanying drawings.

DESCRIPTION OF THE PREFERRED EMBODIMENT

Figure 1:
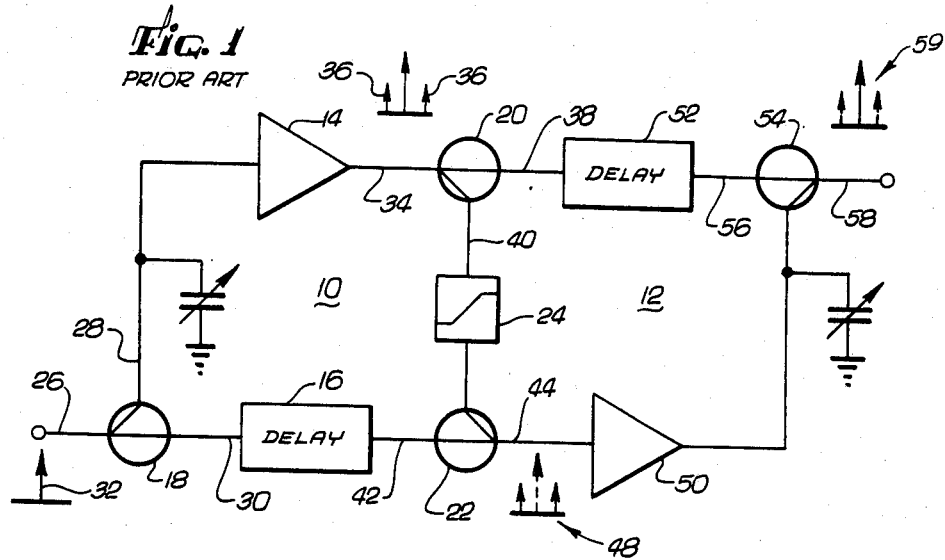
FIG. 1 is a block diagram illustrating the principle of a feed forward amplifier.

As shown in the drawings for purposes of illustration, the present invention is concerned with an improved packaging technique for radio-frequency (rf) devices, such as amplifiers. The technique illustrated is employed in a feed-forward amplifier circuit, which is shown by way of background in FIG. 1.

The basic amplifier circuit comprises a signal cancellation loop, indicated generally by reference numeral 10, and an error cancellation loop 12. The signal cancellation loop 10 includes a main amplifier 14, a delay line 16, first, second and third directional couplers 18, 20 and 22, and an equalizer circuit 24. An input signal to be amplified is input on line 26 to the first coupler 18, which couples energy to two output lines 28 and 30. Line 30 is connected to the delay line 16 and line 28 is connected as an input to the main amplifier 14. The input signal on line 26 is represented as a single-frequency tone, as indicated at 32. After amplification in the main amplifier 14, the signal on output line 34 from the amplifier contains distortion or error signal components, as indicated at 36 by additional smaller frequency tones.

The output signal on line 34 is split by the second coupler 20, and is output along lines 38 and 40. Line 40 passes through the equalization circuit 24 and thence to the third coupler 22. The other input to the third coupler 22 is provided over an output line 42 from the delay line 16. The third coupler 22 functions to subtract one input signal from the other and to produce a difference signal on line 44.

The signal from the delay line 16, on line 42, contains only the original input signal, delayed in the delay line by an amount equivalent to the delay interjected by the main amplifier 14. The signal on line 40 to the third coupler 22 contains both the original signal and the error components. If the phase and amplitude of the original signal components applied to the third coupler 22 are exactly matched, they will cancel in the third coupler 22, leaving an output signal on line 44 that contains only error signal components. This is indicated diagrammatically at 48, where the original signal tone is shown as a broken line.

The function of the equalizer circuit 24 is to perform matching of the signals on lines 40 and 42. Since there are amplitude losses, or negative gain, in the couplers, only slight amplitude correction is typically needed in the equalization circuit 24. But some "slope" correction may be needed, to compensate for variations in amplifier gain over a frequency range.

The error cancellation loop comprises an error amplifier 50, another delay line 52, and a fourth directional coupler 54. The error signal components output from the third coupler 22 on line 44 are amplified in the error amplifier 50 and fed forward to the fourth coupler 54. The distorted signal from the main amplifier 14 is fed through the second coupler 20 and over line 38 to the second delay line 52. The output of this delay line is connected over line 56 as another input to the fourth coupler 54. In this manner, the fed-forward error signal components from the error amplifier 50 are combined subtractively in the fourth coupler 54 with the distorted signal from the main amplifier 14. The second delay line 52 assures an appropriate phase match between the error signals from the two inputs, and the equalizer circuit 24 performs amplitude matching for the error cancellation loop 12 as well as for the signal cancellation loop 10. Accordingly, output from the fourth coupler 54, on line 58, is an amplified form of the original input signal on line 26, with error components removed, as indicated diagrammatically at 59.

Although this basic feed-forward amplifier circuit is well known, producing such a circuit with good characteristics and at relatively low cost presents some significant packaging problems. The problems are principally related to grounding, heat dissipation, and component isolation.

In accordance with the invention, an rf amplifier is packaged to include a single homogeneous ground plane, sandwiched between active components, such as amplifier modules, and a circuit board bearing passive components and circuit interconnections. The sandwiched ground plane construction greatly improves amplifier performance, since grounding paths are kept to an absolute minimum. The construction also facilitates heat dissipation from the active components, and provides good component isolation, as will now be discussed in more detail.

Figure 2:
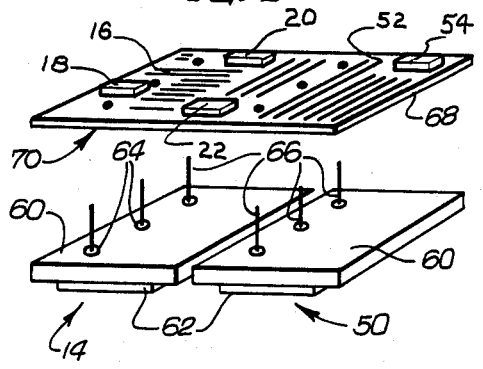
FIG. 2 is an exploded perspective view illustrating the sandwiched ground plane construction of the invention.

FIG. 2 shows how the two amplifier modules, the main and error amplifiers 14 and 50 are mounted on individual copper heat sinks 60. The amplifiers 14 and 50 are formed on substrates 62, which are bonded to the copper heat sinks 60, in which holes 64 are formed to permit connecting pins 66 to pass through the copper material. Amplifier grounding connections are made directly to the heat sinks 60, which become part of the single ground plane for the device.

Passive components of the amplifier device, such as delay lines 16 and 52 (FIG. 1), are mounted on one face of a circuit board 68. Component interconnections are also made on this face of the circuit board 68. The other face of the circuit board 68 is metallized, as indicated at 70. The metallized face 70 is soldered to the the copper heat sinks 60 during assembly, to form a unitary ground plane. Openings are provided in the metallized face 70 to allow the connecting pins 66 to pass through to the upper face of the circuit board 68.

Figure 3:
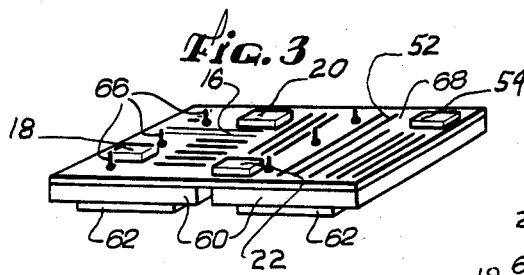
FIG. 3 is a perspective view similar to FIG. 2, but showing the circuit board, active components, and heat sinks in an assembled condition.

When the circuit board 68 and the heat sinks 60 are assembled together, as shown in FIG. 3, the composite ground plane formed with the metallized layer 70 and the copper heat sinks 60 is conveniently located both for the active components on the lower side of the ground plane and for the passive components on the upper face of the ground plane. This satisfies one of the most important requirements in the design of the packaging of the amplifier.

Figure 4:
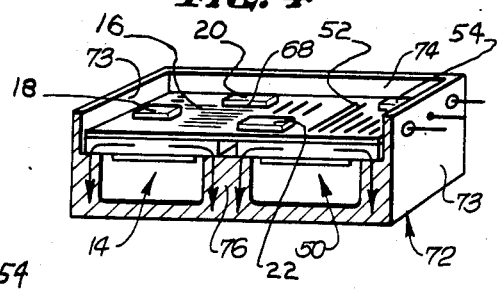
FIG. 4 is a simplified perspective view, partly in section, of the construction of the invention, illustrating heat flow paths.

As best shown in FIG. 4, the assembled components shown in FIG. 3 are placed in a housing 72 of aluminum or some suitable alloy. The housing 72 is basically a hollow box with an open face of substantially the same area as that of the circuit board 68. The end-walls 73 and side walls 74 of the housing 72 have formed in them a ledge 75 (FIG. 5) of uniform height extending around the perimeter of the housing 72. When the circuit assembly shown in FIG. 3 is installed in the housing 72, the ledge 75 comes into contact with edges of the copper heat sinks 60. In the preferred embodiment of the invention as illustrated, the housing 72 also has an integral intermediate wall 76 of the same height as the ledge 75, and positioned to contact adjacent edges of the two heat sinks 60.

The primary sources of heat in the amplifier device are the active components, i.e. the amplifiers 14 and 50. This heat is absorbed initially in the heat sinks 60, and is then transmitted to the housing through the end-walls 73, side walls 74, and the intermediate wall 76. This arrangement provides heat paths of relatively short length and minimizes heating problems in the device.

Figure 5:
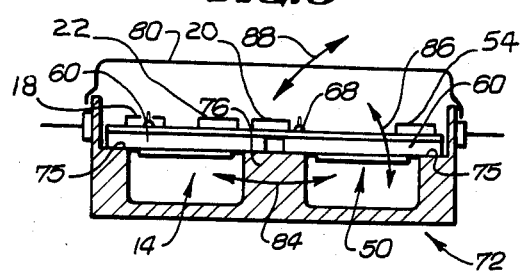
FIG. 5 is a longitudinal sectional view of the construction, illustrating how component isolation is improved.

FIG. 5 shows the device after completion of assembly, with a housing lid 80 installed on the housing 72. The lid may be held on by a suitable adhesive, or by locally heated solder. This figure illustrates the high degree of isolation that is provided by the construction of the invention. The two amplifier modules 14 and 50 are isolated from each other by the intermediate wall 76, as indicated at 84, and are isolated from the passive components on the circuit board 68 by the ground plane 70/60, as indicated at 86. All of the components are suitably isolated from the outside environment by the housing 72 and its lid 80, as indicated at 88.

An important advantage of the construction technique of the invention is that the amplifiers 14 and 50 can be matched and tested prior to assembly with the other components. After assembly, the passive components are readily accessible for tuning purposes, prior to installation of the lid 80.

The construction of the invention lends itself very well to a two-stage assembly process. In the first stage, the amplifiers 14 and 50 and their substrates 62 are bonded to the heat sinks 60, and the other components are installed on the circuit board 68. In the second stage, solder paste is applied to the connections on the circuit board 68, to the heat sinks 60 and to the housing 72, and the entire assembly is heated to reflow the solder. In this manner, the entire device is assembled without any further heating being required, except possibly to install the lid 80. This is an important consideration, since the amplifiers and other components are sensitive to high temperatures.

It will be appreciated from the foregoing that the present invention represents a significant advance in the field of rf amplifier packaging. In particular, the invention provides a technique that gives extremely good grounding properties, good heat flow properties, and good isolation properties. In addition, the technique results in convenience of assembly, tuning and testing. It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. A packaging construction for a radio-frequency (rf) circuit having active and passive components, the construction comprising:
   a circuit board having passive components and circuit connections formed on one face and having its other face metallized;
   active components formed on metal heat sinks, which are bonded to the metallized face of the circuit board to form a single ground plane; and
   a housing having integral means for closely contacting the heat sinks of the active components, to provide heat flow paths into the housing;
   whereby the single ground plane provides extremely good grounding for the active and passive components of the circuit, and whereby heat generated by the active components is efficiently dissipated through the heat sinks to the housing, and the components are well isolated from each other and from the environment.

2. A packaging construction for a radio-frequency (rf) circuit having active and passive components, the construction comprising:
   a circuit board having passive components and circuit connections formed on one face and having its other face metallized;
   active components formed on metal heat sinks, which are bonded to the metallized face of the circuit board to form a single ground plane; and
   a housing having integral means for closely contacting the heat sinks of the active components, to provide heat flow paths into the housing, wherein the means for closely contacting the heat sinks includes a ledge extending around peripheral walls of the housing;
   whereby the single ground plane provides extremely good grounding for the active and passive components of the circuit, and whereby heat generated by the active components is efficiently dissipated through the heat sinks to the housing, and the components are well isolated from each other and from the environment.

3. A packaging construction as set forth in claim 2, wherein:
   the means for closely contacting the housing further includes an intermediate wall of the same height as the ledge, positioned between two active components to contact the heat sinks.

4. A packaging construction of a radio-frequency (rf) amplifier, comprising:
   a circuit board having one face for mounting passive components and circuit interconnections, and an opposite face that is metallized;
   a pair of amplifiers, for amplifying an rf signal, mounted on metal heat sinks, which are in turn mounted in close contact with the metallized face of the circuit board, to form a single ground plane in close proximity to the amplifiers and the passive components; and
   a housing having integral support means for mounting the assembled circuit board, amplifiers and heat sinks, with the heat sinks in close contact with the housing;

whereby heat produced in the amplifiers is conducted readily through the heat sinks to the housing, and the amplifiers are well isolated from each other, from the passive components, and from the outside environment.

5. A packaging construction of a radio-frequency (rf) amplifier, comprising:

a circuit board having one face for mounting passive components and circuit interconnections, and an opposite face that is metallized;

a pair of amplifiers mounted on metal heat sinks, which are in turn mounted in close contact with the metallized face of the circuit board, to form a single ground plane in close proximity to the amplifiers and the passive components; and a housing having integral support means for mounting the assembled circuit board, amplifiers and heat sinks, with the heat sinks in close contact with the housing, wherein the integral support means in the housing includes an integral ledge extending about the peripheral walls of the housing, and an intermediate wall of the same height as the ledge and located between the pair of amplifiers;

whereby heat produced in the amplifiers is conducted readily through the heat sinks to the housing, and the amplifiers are well isolated from each other, from the passive components, and from the outside environment.

6. A packaging construction for a radio-frequency (rf) feed-forward amplifier having two amplifier modules for amplifying an rf signal and a number of passive components, the construction comprising:

a single ground plane positioned between the amplifier modules and the passive components, to provide short grounding paths and a reliable ground for the feed-forward amplifier; and a housing having integral support means for closely contacting the ground plane to provide good heat dissipation from the amplifier modules, whereby heat travels laterally through the ground plane and then into the housing walls, and whereby the ground plane provides isolation between the amplifiers and the passive components.

7. A packaging construction for a radio-frequency feed-forward amplifier having two amplifier modules and a number of passive components, the construction comprising:

a single ground plane positioned between the amplifier modules and the passive components, to provide short grounding paths and a reliable ground for the feed-forward amplifier; and a housing having integral support means for closely contacting the ground plane to provide a good heat dissipation from the amplifier modules, whereby heat travels laterally through the ground plane and then into the housing walls, and whereby the ground plane provides isolation between the amplifiers and the passive components;

wherein the integral support means in the housing includes an integral peripheral ledge and an intermediate wall of the same height as the peripheral ledge, whereby the intermediate wall also serves to provide isolation between the two amplifiers.

8. A packaging construction as set forth in claim 7, and further including:

a circuit board having one face on which the passive components are formed and mounted and another face that is metallized to form part of the ground plane; and a pair of metal heat sinks to which the amplifiers are closely bonded, and which are soldered into close contact with the metallized face of the circuit board, to form the single ground plane.

9. A packaging construction as set forth in claim 7, wherein:

an external ground connection is made directly to the housing.

* * * * *